United States Patent
Nistler et al.

(10) Patent No.: US 11,860,252 B2
(45) Date of Patent: Jan. 2, 2024

(54) MR SYSTEM WITH PARTIAL SHIELDING CABIN AND METHOD FOR OPERATION

(71) Applicant: Siemens Healthcare GmbH, Erlangen (DE)

(72) Inventors: Jürgen Nistler, Erlangen (DE); Rainer Schneider, Erlangen (DE); Georg Seegerer, Erlangen (DE); Stephan Kannengießer, Wuppertal (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/690,125

(22) Filed: Mar. 9, 2022

(65) Prior Publication Data
US 2022/0291310 A1    Sep. 15, 2022

(30) Foreign Application Priority Data

Mar. 9, 2021    (DE) .................. 10 2021 202 235.9
Mar. 9, 2021    (DE) .................. 10 2021 202 236.7

(51) Int. Cl.
*G01R 33/36*    (2006.01)
*G01R 33/421*    (2006.01)
*G01R 33/58*    (2006.01)

(52) U.S. Cl.
CPC ......... *G01R 33/36* (2013.01); *G01R 33/4215* (2013.01); *G01R 33/583* (2013.01)

(58) Field of Classification Search
CPC ... G01R 33/36; G01R 33/4215; G01R 33/583
See application file for complete search history.

(56) References Cited

U.S. PATENT DOCUMENTS

| 6,954,068 B1 * | 10/2005 | Takamori | G01R 33/3854 |
| | | | 324/318 |
| 2008/0132909 A1 * | 6/2008 | Jascob | A61B 34/20 |
| | | | 600/407 |

(Continued)

FOREIGN PATENT DOCUMENTS

| DE | 102020205037 A1 | 10/2021 |
| DE | 102020211606 A1 | 3/2022 |

(Continued)

OTHER PUBLICATIONS

Gao, Xu et al, Far-field prediction using only magnetic near-field scanning for EMI test, IEEE Transactions on Electromagnetic Compatibility; 2014; 8 pp.

*Primary Examiner* — Dixomara Vargas
(74) *Attorney, Agent, or Firm* — Lempia Summerfield Katz LLC

(57) ABSTRACT

A magnetic resonance tomography (MRT) unit includes a field magnet, a transmitter, and a transmitting antenna. The MRT unit also has a transmission interference suppression facility with a transmission interference suppression controller, a plurality of sensors, and a transmission interference suppression antenna. The transmission interference suppression facility is configured to pick up, with the sensors, an excitation signal of the transmitter, determine, with the transmission interference suppression controller, a transmission interference suppression signal as a function of the excitation signal of the transmitter, and emit the signal via the transmission interference suppression antenna, so that at a predetermined location outside of the MRT unit, an electromagnetic alternating field of an excitation signal emitted by the transmitter via the transmitting antenna is attenuated. The sensors are arranged in a near field of the (Continued)

transmitting antenna, and the predetermined location of the attenuation is in a far field of the transmitting antenna.

20 Claims, 5 Drawing Sheets

(56) References Cited

U.S. PATENT DOCUMENTS

| | | | | |
|---|---|---|---|---|
| 2010/0060282 | A1* | 3/2010 | Shvartsman | G01R 33/421 |
| | | | | 324/318 |
| 2013/0197349 | A1* | 8/2013 | Blumhagen | G01R 33/481 |
| | | | | 600/411 |
| 2020/0132792 | A1* | 4/2020 | Vermilyea | G01R 33/3856 |
| 2020/0237320 | A1* | 7/2020 | Fang | G01R 33/481 |
| 2020/0249292 | A1* | 8/2020 | Biber | G01R 33/4818 |
| 2021/0025954 | A1* | 1/2021 | Biber | G01R 33/3621 |
| 2021/0208294 | A1* | 7/2021 | Wu | G01T 1/202 |
| 2021/0325494 | A1* | 10/2021 | Biber | G01R 33/546 |
| 2022/0018919 | A1* | 1/2022 | Grodzki | G01R 33/3614 |
| 2022/0082642 | A1* | 3/2022 | Biber | G01R 33/34038 |
| 2022/0137168 | A1* | 5/2022 | Nistler | G01R 33/422 |
| | | | | 324/309 |
| 2022/0187394 | A1* | 6/2022 | Biber | G01R 33/3621 |
| 2023/0087433 | A1* | 3/2023 | Schneider | G01R 33/422 |

FOREIGN PATENT DOCUMENTS

| | | |
|---|---|---|
| DE | 102020211608 A1 | 3/2022 |
| DE | 102020213938 A1 | 5/2022 |
| WO | 2019068687 A2 | 4/2019 |

* cited by examiner

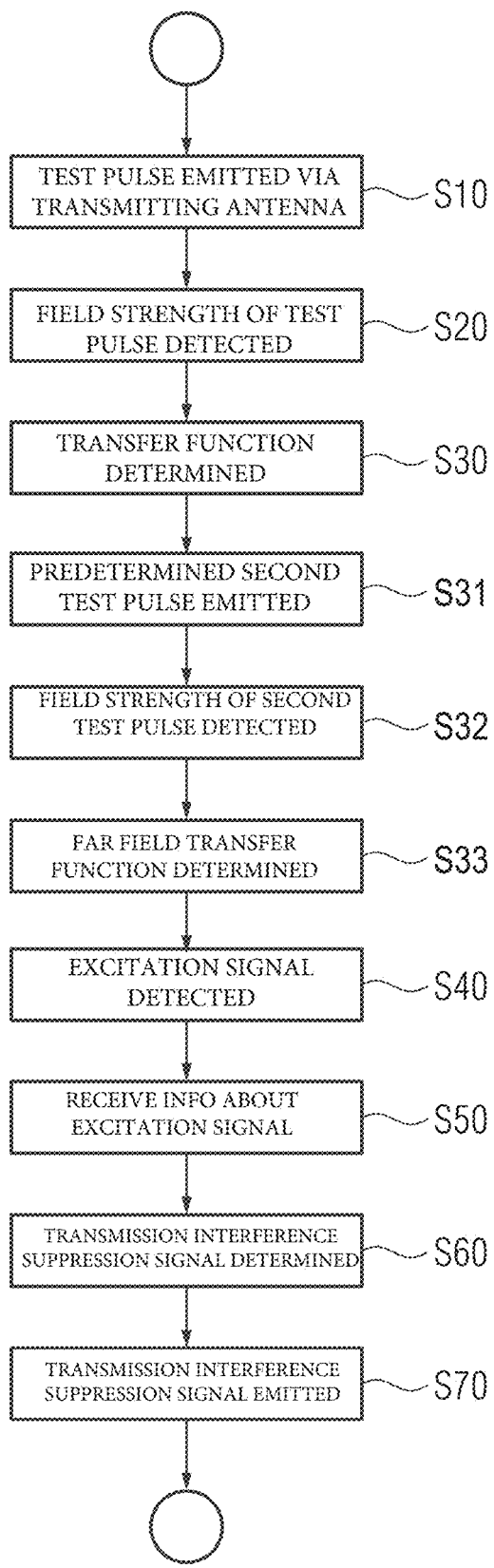

MR SYSTEM WITH PARTIAL SHIELDING CABIN AND METHOD FOR OPERATION

This application claims the benefit of German Patent Application No. DE 10 2021 202 236.7, filed on Mar. 9, 2021, and German Patent Application No. DE 10 2021 202 235.9, filed on Mar. 9, 2021, which are hereby incorporated by reference in their entirety.

BACKGROUND

The present embodiments relate to a magnetic resonance tomography unit.

Magnetic resonance tomography units are imaging apparatuses that, for mapping an examination object, orient nuclear spins of the examination object with a strong external magnetic field and, via a magnetic alternating field, excite the nuclear spins for precession about this orientation. The precession or return of the spins from this excited state into a state with less energy generates, in response, a magnetic alternating field that is received via antennas.

With the aid of magnetic gradient fields, a spatial encoding is impressed on the signals, which subsequently enables an allocation of the received signal to a volume element. The received signal is then evaluated, and a three-dimensional imaging representation of the examination object is provided. For reception of the signal, local receive antennas, known as local coils, may be used. In order to achieve a better signal-to-noise ratio, the local coils are arranged directly on the examination object. The receive antennas may also be installed in a patient couch.

Magnetic resonance tomography units require radio-frequency shielding in two respects. First, in order to excite the nuclear spins, radio-frequency pulses with powers in the kilowatt range, which are only partially absorbed in the patient, are generated. Radio waves, which leave the patient feed-through, are emitted into the space and are to be shielded in order to observe emission limit values.

Conversely, the magnetic resonance signals to be received for imaging are extremely weak. To achieve an adequate signal-to-noise ratio (SNR) here, shielding of external interference signal is to be provided.

For this reason, in the prior art, elaborate shielding cabins are installed around a magnetic resonance tomography unit to reduce both emissions and immissions.

A magnetic resonance tomography unit with active interference suppression and a method for operation is known from document WO 2019/068687 A2.

With apparatuses of this kind, it is difficult to achieve stable interference suppression with different types of interference.

SUMMARY AND DESCRIPTION

The scope of the present invention is defined solely by the appended claims and is not affected to any degree by the statements within this summary.

The present embodiments may obviate one or more of the drawbacks or limitations in the related art. For example, improved and more cost-effective interference suppression is provided.

An embodiment of a magnetic resonance tomography unit includes a magnetic unit, a transmitter, and a transmitting antenna for exciting nuclear spins. Owing to the achievable field strengths of the static magnetic field BO, which determines the resonance frequency or Larmor frequency of the nuclear spins, a field magnet of the magnetic unit is conventionally configured as a superconducting magnet.

The magnetic resonance tomography unit also has a transmission interference suppression facility with a transmission interference suppression controller, a plurality of sensors, and a transmission interference suppression antenna. The transmission interference suppression facility is configured to pick up, with the sensor, a pulse of the transmitter.

The sensor may be, for example, an antenna (e.g., a conductor loop), in which a voltage is induced by a magnetic component of an excitation signal. Any radio-frequency magnetic alternating field that the magnetic resonance tomography unit emits is regarded as an excitation signal in this case. Conventionally, the excitation signal is emitted in the form of time-limited, usually short excitation pulses. The excitation signal may be a test pulse for calibrating the interference suppression facility, but also an excitation pulse in order to influence the orientation of nuclear spins in the patient in the magnetic field BO. The sensor relays a signal via the pulse to the transmission interference suppression controller. The signal may be, for example, a voltage or a current that is proportional to the induced current or, in the case of an electric antenna, to the voltage produced by the electric field. The signal may also be digitized already by an analog-to-digital converter, however. A sensor may also be configured to define a polarization of the field (e.g., for the H-field by two orthogonal antenna loops or for the E-field by two dipoles oriented perpendicularly to each other).

The transmission interference suppression controller is configured to determine a transmission interference suppression signal as a function of the picked-up pulse of the transmitter and to emit the transmission interference suppression signal via the transmission interference suppression antenna, so that at a predetermined location, in the far field of the transmitting antenna outside of the magnetic resonance tomography unit, the excitation signal emitted by the transmitter via the transmitting antenna is attenuated. An electromagnetic alternating field, generated by the transmitting antenna, in which H- and E-field are in phase and which conventionally prevails at a spacing greater than once, twice, or four times the wavelength, is regarded as a far field. The attenuation may be achieved in that, for example via the transmission interference suppression antennas via phase shift and amplification/attenuation, a signal that attenuates or eliminates the excitation signal via destructive interference in the far field is provided. In one embodiment, the parameters phase shift and attenuation are varied in an optimization method, so that the field strength in the far field is minimal.

In an embodiment of the magnetic resonance tomography unit, the plurality of sensors tightly surround the transmitting antenna at least in one interference suppression direction.

For observance of the limit values throughout the three-dimensional surrounding space, an arrangement on a surface of a three-dimensional body (e.g., a sphere, a cuboid, a tetrahedron, generally a polyhedron, or also an irregular body) completely enclosing the transmitting antenna is correspondingly necessary. The interference suppression direction then includes all spatial directions.

"Tightly" designates a spacing of the sensors from each other in the interference suppression direction, which, owing to the electromagnetic field equations, allows the field at a location in the interference suppression direction with a greater spacing than that of the sensors from the magnetic resonance tomography unit to be determined. The knowledge of the electromagnetic fields, which is complete in this sense for the interference suppression direction, allows a virtual source to be determined by analogy with a Huygens' box from the fields at the surface of the Huygens' box and with this source, the fields in the far field outside of the Huygens' box. For this, it is necessary for the spacing of the sensors on the surface to not exceed a certain maximum spacing (e.g., not greater than one tenth, one eighth, or one quarter of a wavelength of the excitation signal emitted by the transmitting antenna in the free space).

In one embodiment, the sensors are configured to quantitatively detect tangential components of H-field and/or E-field relative to the surface of the body.

This interference suppression direction may, however, also be, for example, a plane or a solid angle in which limit values for electromagnetic emissions are to be observed. Conventionally, the interference suppression direction is a horizontal plane or sectors in this plane in which people may move around and approach the magnetic resonance tomography unit. A vertical plane may also be provided if, for example, people in a multi-story house may also stay above the magnetic resonance tomography unit. The consistency of the electromagnetic fields and linear propagation of the waves thus allows the propagation in the interference suppression direction to be inferred, even with incomplete coverage of a casing or surface around the transmitting antenna or Huygens' box, by way of sensors by analogy with a Huygens' box. This applies, for example, to a transmitting antenna in the patient tunnel if this is limited by metal walls because a corresponding dense coverage of the opening by a network of sensors is sufficient, for example, since only here too may electromagnetic alternating fields escape to any appreciable extent.

The spacing of the sensors from each other may be less than a quarter of the wavelength in the free space of a radio-frequency signal with the Larmor frequency of the magnetic resonance tomography unit.

In one embodiment, sensors that fully or at least partially tightly enclose the transmitting antenna, with the sensors in the near field, allow the far field emission to be determined and monitored, so that an installation in the space remote from the magnetic resonance tomography unit may be avoided. The reduction of the fields in the far field results in the interference field being reduced or minimized not only in the far field in the surroundings of the magnetic resonance tomography unit itself but also for a wave propagating from the interference source and beyond this location into the surroundings.

In one embodiment, the magnetic resonance tomography unit has a magnetic unit, a transmitter, and a transmitting antenna for exciting nuclear spins. Owing to the achievable field strengths of the static magnetic field BO, which determines the resonance frequency or Larmor frequency of the nuclear spins, a field magnet of the magnetic unit is conventionally configured as a superconducting magnet.

Further, the magnetic resonance tomography unit has a partial shielding. An apparatus that is configured to attenuate an electromagnetic field with a frequency corresponding to the Larmor frequency of the magnetic resonance tomography unit by more than 6 dB, 12 dB, 18 dB, or more if the partial shielding is arranged between a field source of the electromagnetic alternating field and a field measuring device in the first spatial direction for detecting the alternating field is regarded as a partial shielding in this case. The partial shielding may be made, for example, of an electrically conductive material such as metal, be solid, or have perforations that are smaller than half a wavelength of an electromagnetic wave with the Larmor frequency. In one embodiment, perforations may be divided by radio frequency-conducting bridges such as capacitors into smaller partial perforations in order to reduce eddy currents and simultaneously be permeable to the electromagnetic alternating field.

In one embodiment, a partial shielding is regarded as a shielding around the transmitting antenna of the magnetic resonance tomography unit, which does not enclose this in its entirety in all spatial directions but has at least one opening. In one embodiment, in terms of dimensions, the opening is not smaller than one half, one quarter, or one tenth of the wavelength of an electromagnetic wave with the Larmor frequency. In a subsequently described embodiment, the patient tunnel may, however, be part of the partial shielding and the opening of the partial shielding to match an opening of the patient tunnel. The partial shielding is arranged in a first spatial direction relative to the magnetic resonance tomography unit and shields the magnetic resonance tomography unit in at least the first spatial direction.

In a further embodiment, the partial shielding may also be regarded as a shielding that, owing to its properties, such as material, thickness, shape, or perforations, has an attenuation that is not sufficient to observe legal limit values outside of or on the side of the shielding remote from the transmitting antenna with respect to emissions. For example, the attenuation may be less than 18 dB, 12 dB, or 6 dB at a spacing of one or 5 meter(s) from the partial shielding. In one embodiment, the partial shielding may nevertheless reduce the demands on the active interference suppression and, in cooperation with reduced costs overall, observe EMC regulations.

The magnetic resonance tomography unit also has a transmission interference suppression facility with a transmission interference suppression controller, a sensor, and a transmission interference suppression antenna. The transmission interference suppression facility is configured to pick up, with the sensor, an excitation signal of the transmitter for exciting nuclear spins.

The sensor may be, for example, an antenna (e.g., a conductor loop), in which a voltage is induced by a magnetic component of an excitation signal. Any radio-frequency magnetic alternating field that the magnetic resonance tomography unit emits in order to influence the orientation of nuclear spins in the patient in the magnetic field BO is regarded as an excitation signal in this case. Conventionally, the excitation signal is emitted in the form of time-limited, usually short excitation pulses. The sensor relays a signal via the excitation signal to the transmission interference suppression controller. The signal may be, for example, a voltage or a current that is proportional to the induced current or, with an electric antenna, to the voltage produced by the electric field. The signal may also be digitized already by an analog-to-digital converter, however. A sensor may also be configured to define a polarization of the field (e.g., for the H-field via two orthogonal antenna loops or for the E-field via two dipoles oriented perpendicularly to each other).

The transmission interference suppression controller is configured to determine a transmission interference suppression signal as a function of the picked-up excitation signal of the transmitter and to emit the transmission interference suppression signal via the transmission interference suppression antenna, so that at a predetermined location outside of the magnetic resonance tomography unit, the excitation signal emitted by the transmitter via the transmitting antenna is attenuated. This may be achieved in that, for example, via the transmission interference suppression antennas via phase shift and amplification/attenuation, a signal is provided that attenuates or eliminates the excitation signal by destructive interference at the location of the sensor. In one embodiment, the parameters phase shift and attenuation may be varied in an optimization method, so that the field strength in the far field is minimal.

The partial shielding makes it possible to reduce the number of sensors and transmission interference suppression antennas and replace the number of sensors and transmission interference suppression antennas with a partial shielding without raising the emission above the EMC limit value. Easy access to the patient through the opening in the partial shielding is simultaneously possible.

The method of one or more of the present embodiments has an act of emitting a first test pulse with the transmitter via the transmitting antenna. A time-limited, predetermined radio-frequency wave train with known amplitude, frequency, and phase is regarded as a first test pulse. In one embodiment, the amplitude is much smaller than with an excitation signal (e.g., by more than 20 dB, 40 dB, or 60 dB).

In a further act, the sensors detect a field strength of the radio-frequency electromagnetic field produced by the first test pulse, depending on sensor, for example, E-field and/or H-field. In one embodiment, at least the components of the field that are tangential to a surface of a casing or curve on which the sensors are arranged around the transmitting antenna are detected.

In a further act, the transmission interference suppression controller may determine a far field transfer function of the transmitting antenna. At least an attenuation of the amplitude or a proportionality factor between amplitude of the test pulse and the field strength produced before it at a predetermined location in the far field and a delay or phase shift of the first test pulse at the predetermined location is regarded as a transfer function in this case. For example, in accordance with a Huygens' box, a source located therein in the form of the transmitting antenna and a wave propagating from the transmitting antenna in the far field may be inferred from the signals of the sensors on the surface of the Huygens' box. For this, a virtual signal source may be determined with the field equations from the E- and H-fields tangentially to the surface and for this signal source, the transfer function for a predetermined location in the far field may then be determined. For this, the sensors are to enclose the transmitting antenna on a casing with a small spacing at least in one plane on a curve or also in all spatial directions.

The method also has the act of receiving information about the excitation signal. In one embodiment, the information relates to an amplitude or phase of the excitation signal. The information may be, for example, the signal of an antenna loop, a directional coupler, or a current sensor in a signal link between transmitter and transmitting antenna. Information via the controller of the magnetic resonance tomography unit relating to frequency, amplitude, or frequency of the excitation signal may also be provided, however.

In a further act of the method, the transmission interference suppression controller determines a transmission interference suppression signal as a function of the information such that on emitting the transmission interference suppression signal via the transmission interference suppression antenna, a field strength of the excitation signal is reduced at a predetermined location in the far field. An exemplary method of determining has already been stated in conjunction with the apparatus.

In a further act of the method, the transmission interference suppression facility transmits the transmission interference suppression signal via the transmission interference suppression antenna.

In one embodiment, the method has the act of receiving information about the excitation signal. In one embodiment, the information relates to an amplitude or phase of the excitation signal. The information may be, for example, the signal of an antenna loop as the sensor.

In a further act of the method, the transmission interference suppression controller determines a transmission interference suppression signal as a function of the information such that on emitting the transmission interference suppression signal via the transmission interference suppression antenna, a field strength of the excitation signal is reduced at a predetermined location. An exemplary approach for determining the transmission interference suppression signal has already been stated in relation to the apparatus.

In a further act of the method, the transmission interference suppression facility transmits the transmission interference suppression signal via the transmission interference suppression antenna.

The method shares the advantages of the magnetic resonance tomography unit of the present embodiments.

Further advantageous embodiments are disclosed below.

In one possible embodiment of the magnetic resonance tomography unit, the magnetic resonance tomography unit has a calibration antenna for receiving a calibration signal. A calibration antenna is configured to detect an electric and/or magnetic field and output a signal that indicates a measure of the strength of the field. In one embodiment, the signal also provides information about a phasing with respect to the emitted test pulse. The calibration signal may be a signal that is emitted with predetermined signal strength with the transmitter via the transmitting antenna or the transmission interference suppression antenna. When receiving the calibration signal, the calibration antenna is arranged at a greater spacing from the transmitting antenna or the transmission interference suppression antennas than the sensors. In one embodiment, the magnetic resonance tomography unit may have a plurality of calibration antennas, or the calibration antenna is positioned, as will be explained below in relation to the method, at different locations with an appropriate spacing.

In one embodiment of the magnetic resonance tomography unit, the plurality of sensors surround the transmission interference suppression antenna in its entirety at least in one interference suppression plane. That which was stated previously in relation to the arrangement of the sensors with respect to the transmitting antenna similarly applies to transmission interference suppression antenna(s) with respect to the sensors arranged around them (e.g., with respect to spatial arrangement and spacing).

In one embodiment, the sensors arranged around the transmission interference suppression antennas allow the far field of the transmission interference suppression antennas to be inferred from field information obtained in the near field.

For example, if the sensors enclose both the transmitting antenna and the transmission interference suppression antenna, emission limit values may be observed in the far field even without a sensor in the far field.

In one embodiment of the magnetic resonance tomography unit, the predetermined location is predefined by a spacing for an EMC limit value predetermined by regulations. A limit value that is not to be exceeded is predetermined for the E- and/or H-field value by regulatory specifications for this location. The limit value may be, for example, a spacing of more than 5 m or more than 10 m from the transmitting antenna. Limitation of access to the magnetic resonance tomography unit, such as a partition, wall, door, or the like, may also be provided.

In one embodiment, the sensor at the limitation of the restriction provides that, outside of the limitation, the limit values are reliably observed.

In one possible embodiment of the magnetic resonance tomography unit, the transmission interference suppression controller has a signal link to the transmitter. The signal link is configured to receive information about the excitation signal. This may be, for example, a radio-frequency cable that conducts a signal of the excitation signal attenuated by a predetermined factor (e.g., by the factor 40 dB, 60 dB, or more) from the output stage of the transmitter to the transmission interference suppression controller. Conducting the unamplified signal upstream of the output stage with the radio-frequency cable to the transmission interference suppression controller may also be provided. A digital or wireless transmission may also be provided. During transmission to the transmission interference suppression controller, the information is not changed by external circumstances, such as the patient, directly during transmission. The transmission interference suppression controller is configured to determine the transmission interference suppression signal as a function of the received information. For example, the transmission interference suppression signal may be obtained by attenuation/amplification and/or phase shift.

In one embodiment of the magnetic resonance tomography unit, the information about the excitation signal indicates an amplitude and/or phase of the excitation signal. For example, the information may be the signal proportional to the excitation signal or a digitally sampled signal with a sampling frequency above the minimum sampling rate defined by Nyquist. With a signal that is constant over time, an indication of the maximum amplitude and frequency and a phase may also be provided, however. Mixed forms, such as the amplitude, frequency, and phase of a carrier wave and a baseband signal to be modulated may be provided.

In one embodiment, by transferring the information to the transmission interference suppression controller, the controller may in each case adjust the interference suppression signal to the current excitation signal.

In one possible embodiment of the magnetic resonance tomography unit, the information about the excitation signal is proportional to a magnetic field generated by the transmitting antenna. In other words, the transmission interference suppression facility receives information about the excitation signal that indicates a magnetic field strength of the excitation signal emitted by the transmitting antenna or is proportional to the magnetic field strength.

Considerable differences in the magnetic field strength may occur between an output signal generated by the transmitter and magnetic field strength generated therefrom by the transmitting antenna (e.g., in the case of different frequencies or different loads due to a patient). The differences directly affect the field strength of the wave propagating into the space. Active interference suppression may be better established, therefore, with more precise knowledge of the magnetic fields.

In one embodiment of the magnetic resonance tomography unit, the transmission interference suppression facility has a directional coupler. The directional coupler is arranged at a signal link between transmitter and transmitting antenna, so that a current intensity of a current flowing in the direction of the transmitting antenna is detected by the directional coupler as a signal. In one embodiment, the directional coupler is arranged close (e.g., less than 10% of a wavelength of the center frequency of the excitation signal at the signal link) to a foot or feeding point of the transmitting antenna. In one embodiment, two directional couplers are arranged on the signal link, and these pick up the current flow in each case of the excitation signal flowing to the antenna and of the reflected excitation signal, so that a difference may be formed therefrom.

In one embodiment, the current flow that directly affects the fields may be detected by the directional coupler. An arrangement in the proximity of the foot provides that phase shifts between current and voltage are minimized; two opposed directional couplers allow the reflected current to be directly detected and taken into account.

In one possible embodiment of the magnetic resonance tomography unit, the transmission interference suppression facility has a radio-frequency amplifier that is arranged in the immediate proximity of the transmission interference suppression antenna. Arranged in the immediate proximity is regarded as being when the spacing from a feeding point or foot of the transmission interference suppression antenna is less than one tenth of the wavelength of the center frequency of the excitation signal on the signal line. In one embodiment, the radio-frequency amplifier is a current source amplifier (e.g., the amplifier applies a voltage to the transmitting antenna such that it enforces a predetermined current, independently of a variation in load or impedance).

The proximity (e.g., with a current source-amplifier) provides that, due to the enforced current in the antenna, the emitted transmission interference suppression signal also substantially matches the signal that is supplied to the radio-frequency amplifier by the transmission interference suppression controller. For example, frequency dependencies are minimized thereby.

In an embodiment of the magnetic resonance tomography unit, the transmission interference suppression facility has a plurality of sensors and/or transmission interference suppression antennas at in each case different locations. For example, the sensors and/or transmitting antennas may surround the transmitting antenna or the magnetic resonance tomography unit in a plane (e.g., horizontally), in which people or other possibly disruptive apparatuses are located. In one embodiment, the arrangement may completely enclose the transmitting antenna in all spatial directions, however, in order to prevent interference in all spatial directions. The sensors for the respective adjacent sensor have a spacing that is less than, for example, a quarter or a tenth of a wavelength of the excitation signal.

The transmission interference suppression facility is also configured to determine a transmission interference suppression signal as a function of the excitation signal of the transmitter picked up via the plurality of sensors and to emit the transmission interference suppression signal via the transmission interference suppression antennas, so that at predetermined locations in the far field, the excitation signal emitted by the transmitter via the transmitting antenna is attenuated. For example, the transmission interference suppression controller may determine the phase shifts and attenuations of the individual transmission interference suppression signals via an optimization method such that, due to interference, the sum of the energies at the predetermined locations in the far field is minimized.

In one embodiment of the magnetic resonance tomography unit, the transmission interference suppression signal has a plurality of components. For example, these may be signals that in each case differ by way of phase and amplitude. The transmission interference suppression facility is configured to emit in each case one component via one transmission interference suppression antenna of the plurality of transmission interference suppression antennas. For example, the transmission interference suppression facility may have a plurality of radio-frequency amplifiers that amplify the components and via signal lines conduct the components to a plurality of transmitting antennas, via which the transmission interference suppression signal or its components are emitted.

In one embodiment, the transmission interference suppression facility may thus achieve a reduction in emission in many predetermined directions.

In one embodiment of the method, the method also has the act of arranging the calibration antenna at a location at a greater spacing from the transmitting antenna than the sensors and/or the transmission interference suppression antennas. In one embodiment, the spacing of this additional calibration antenna from the transmitting antenna is at least as large as results from the requirements of the EMC regulations. For example, a spacing of 10 m or less at which the field is to be below a defined threshold is stipulated. A spacing of less than 8 m or 5 m may also be provided. The spacing may also depend on the wavelength of the signals emitted by the transmitting antenna during operation (e.g., less than n-fold of the wavelength in air or a vacuum, where n is 3, 2 or 1).

In one act, the calibration antenna detects a field strength produced by the first test pulse at the location of the calibration antenna. The signal may indicate, for example, the electric or magnetic field strength absolutely or also be proportional to the electric or magnetic field.

In the act of determining the interference suppression signal as a function of the far field transfer function, the signal is also determined as a function of the detected field strength of the calibration antenna. In the simplest case, a simple scaling of the interference suppression signal may take place based on the strength of the signal of the calibration antenna.

In one embodiment, the calibration antenna is arranged at different locations (e.g., in different directions with respect to the transmitting antenna) at the predefined spacing; in each case, a first test pulse is emitted, and with the calibration antenna, in each case, a received signal of the first test pulse is detected for the locations. Alternatively, a large number of calibration antennas may also be arranged at the different locations, and at the same time, received signals of the calibration antennas may be detected for a first test pulse.

Similar to a Huygens' box, the sensor antennas may describe the effect of the source in the interior. It is not possible to infer the propagation properties outside from this, however. With the aid of the first test pulses and the calibration antenna, the effect of the surroundings (e.g., ceiling, floor, walls, and other items) on the propagation of the excitation pulses may be inferred, and these may be used when determining the transmission interference suppression signals in order to reduce the emissions in the distance (e.g., at the location or the locations of the calibration antenna).

In one embodiment, the first test pulse may also be detected with the sensors. In this way, a transfer function between transmitting antenna and sensors may simultaneously be determined, which may be taken into account directly or as the inverse thereof when determining the transmission interference suppression signal.

In one embodiment of the method, in a further act, a predetermined second test pulse is emitted with the transmission interference suppression facility via the transmission interference suppression antenna. The second test pulse may be the same as the first test pulse, but a changed amplitude, for example, that is adjusted to the transmission interference suppression antenna may also be provided.

In a further act, the plurality of sensors detect a field strength produced by the second test pulse.

In a further act, the transmission interference suppression facility determines a far field transfer function for the transmission interference suppression antenna as a function of the second test pulse.

With a plurality of transmission interference suppression antennas, these acts may be repeated for each transmission interference suppression antenna, and a far field transfer function is thus ascertained for each transmission interference suppression antenna.

The act of the determining the transmission interference suppression signal takes place as a function of the transfer function(s) thus ascertained. For example, the interference signal at a predetermined location in the far field may be determined by applying the determined transfer function between transmitting antenna and the location in the far field to the excitation signal emitted by the transmitting antenna. By inverting the sign and applying an inverse of a transfer function between transmission interference suppression antenna and sensor, the transmission interference suppression signal may be ascertained, which is to be emitted in order to reduce the field strength of the excitation signal at the predetermined location in the far field via the transmission interference suppression antennas. For a plurality of sensors, transmission interference suppression antennas and predetermined locations of co-reduced field strength of the excitation signal, the amplification and phase shift for each transmission interference suppression antenna or the supplying radio-frequency amplifier may be set in a linear optimization.

The ascertained transfer function(s) simplify and accelerate determining of the transmission interference suppression signals.

In one embodiment of the method, the calibration antenna is arranged at a location at a greater spacing from the transmission interference suppression antenna than the sensors. This may also take place in each case jointly with the calibrating of the transmitting antenna already described (e.g., the position of the calibration antenna is in each case used for detecting the first test pulse and of the subsequently described second test pulses).

In the act of detecting a field strength produced by the second test pulse by the plurality of sensors, a field strength produced by the second test pulse is also detected by the calibration antenna.

In the act of determining the interference suppression signal as a function of the far field transfer function of the transmission interference suppression antenna, the transmission interference suppression signal is also ascertained as a function of the detected field strength of the calibration antenna. A simple scaling or with a large number of transmission interference suppression antennas (e.g., an inverse transfer function that may be applied to the transmission interference suppression signals) is again conceivable.

In one embodiment, the acts of detecting the second test pulse with a plurality of transmission interference suppression antennas are repeated for each individual transmission interference suppression antenna and for different positions of the calibration antenna.

By detecting the second test pulse with the calibration antenna, the effects of the surroundings outside of the sensors may, as already described, be taken into account, and thus, the noise emission at a greater spacing may be reduced.

In one possible embodiment, the sensor is arranged in a second spatial direction relative to the magnetic resonance tomography unit, which is different than the first spatial direction in which the partial shielding is arranged relative to the transmitting antenna.

In one embodiment, the sensor may detect emitted noise that is not shielded by the partial shielding and may thus be used for active interference suppression of this emission by the transmission interference suppression facility.

In one embodiment, the partial shielding shields the magnetic resonance tomography unit in a plurality of different spatial directions. The partial shielding may assume, for example, the shape of a cuboid, a polygon, or a different surface or hollow body that encloses the transmitting antenna in the direction of one, two, or three axes of a Cartesian coordinate system in the positive and/or negative axis direction.

In one embodiment, partial shielding in a plurality of spatial directions may further reduce the expenditure for the active interference suppression. This applies, for example, if access to the patient tunnel is not required from these spatial directions.

In one possible embodiment of the magnetic resonance tomography unit, the magnetic resonance tomography unit has a patient tunnel. The patient tunnel has two openings at opposing ends of the patient tunnel. The partial shielding electromagnetically closes the patient tunnel at one end. The field strength at a field measuring device, arranged along a straight line through the transmitting antenna and the opening in the direction of the opening outside of the patient tunnel is reduced with the partial shielding with respect to a measured value without partial shielding by at least 6 dB, 12 dB, 14 dB, or 48 dB. The partial shielding may be configured, for example, as a cover for the opening, as a dome over the opening, or as a closed electromagnetic extension of the patient tunnel.

The arrangement of the partial shielding at an opening of the patient tunnel may be effective owing to the electromagnetic closure of the patient tunnel in this direction.

In one embodiment of the magnetic resonance tomography unit, the sensor is arranged at a spacing, so that the sensor picks up a far field of the transmitting antenna. An electromagnetic alternating field, generated by the transmitting antenna, in which H- and E-field are in phase and which conventionally prevails at a spacing greater than one, two, or four times the wavelength, is regarded as a far field in this case.

In one embodiment, the sensor arranged in the far field may result in the interference field being reduced or minimized not just at the location of the sensor itself, but also for a wave propagating from the interference source and beyond this location into the surroundings.

In one embodiment, a plurality of sensors may tightly enclose the transmitting antenna, with a spacing of the sensors from each other of less than, for example, a quarter of the wavelength of an electromagnetic wave of the excitation pulse, so that the transmission source is completely detected by the sensors in line with a Huygens' box and the field outside of the Huygens' box may be modeled. In one embodiment, some of the sensors may be replaced by the partial shielding that is largely impermeable to the electromagnetic fields.

In one embodiment of the magnetic resonance tomography unit, the predetermined location is specified by a spacing for an EMC limit value predetermined by regulations. A limit value that is not to be exceeded for the E- and/or H-field value is predetermined for this location by regulatory specifications. The limit value may be, for example, a predetermined spacing of more than 5 m or more than 10 m from the transmitting antenna. Limitation of access to the magnetic resonance tomography unit, such as a partition, wall, door, or the like may also be provided.

In one embodiment, the sensor at the limitation of the restriction provides that, outside of the limitation, the limit values are reliably observed.

In one embodiment, however, a field in the far field that is emitted by the transmitting antenna and/or the transmission interference suppression antennas may be detected with one or more calibration antennas, and a transfer function between transmitting antenna or transmission interference suppression antennas and the calibration antenna may thus be determined in order to determine the effect of the signals emitted by the transmitting antenna and the transmission interference suppression antennas on the far field. This may be taken into account in the method when determining transmission interference suppression signals.

In one possible embodiment of the magnetic resonance tomography unit, the transmission interference suppression controller has a signal link to the transmitter. The signal link is configured to receive information about the excitation signal. This may be, for example, a radio-frequency cable that conducts a signal of the excitation signal attenuated by a predetermined factor (e.g., by 40 dB, 60 dB, or more) from an output stage of the transmitter to the transmission interference suppression controller. In one embodiment, the unamplified signal upstream of the output stage may be conducted with the radio-frequency cable to the transmission interference suppression controller. A digital or wireless transfer may also be provided. It is to be provided that, during transmission to the transmission interference suppression controller, the information is not changed by external influences, such as the patient, directly during transmission. The transmission interference suppression controller is configured to determine the transmission interference suppression signal as a function of the received information. For example, the transmission interference suppression signal may be obtained by attenuation/amplification and/or phase shift.

In one embodiment of the magnetic resonance tomography unit, the information about the excitation signal indicates an amplitude and/or phase of the excitation signal. For example, the information about the excitation signal may be proportional to the excitation signal or be a digitally sampled signal with a sampling frequency above the minimum sampling rate defined by Nyquist. With a signal that is constant over time, an indication of the maximum amplitude and frequency and a phase may also be provided, however. Mixed forms, such as the amplitude, frequency, and phase of a carrier wave and a baseband signal to be modulated, may also be provided.

In one embodiment, by transferring the information to the transmission interference suppression controller, the controller may in each case adjust the interference suppression signal to the current excitation signal.

In one embodiment of the magnetic resonance tomography unit, the information about the excitation signal is proportional to a magnetic field generated by the transmitting antenna. In other words, the transmission interference suppression facility receives information about the excitation signal, which indicates a magnetic field strength of the excitation signal emitted by the transmitting antenna or is proportional to the magnetic field strength.

Considerable differences in the magnetic field strength may occur between an output signal generated by the transmitter and magnetic field strength generated therefrom by the transmitting antenna (e.g., in the case of different frequencies or different loads due to a patient); the differences directly affect the field strength of the wave propagating into the space. Active interference suppression may be better established therefore with more precise knowledge of the magnetic fields.

In one embodiment of the magnetic resonance tomography unit, the transmission interference suppression facility has a directional coupler. The directional coupler is arranged at a signal link between transmitter and transmitting antenna, so that a current intensity of a current flowing in the direction of the transmitting antenna is detected by the directional coupler as a signal. In one embodiment, the directional coupler is arranged close (e.g., less than 10% of a wavelength of the center frequency of the excitation signal at the signal link) to a foot or feeding point of the transmitting antenna. In one embodiment, two directional couplers are arranged on the signal link. The two directional couplers pick up the current flow in each case of the excitation signal flowing to the antenna and of the reflected excitation signal, so that a difference may be formed therefrom.

In one embodiment, the current flow, which directly affects the fields, may be detected by the directional coupler. An arrangement in the proximity of the foot provides that phase shifts between current and voltage are minimized. Two opposed directional couplers allow the reflected current to be directly detected and taken into account.

In one possible embodiment of the magnetic resonance tomography unit, the transmission interference suppression facility has a radio-frequency amplifier that is arranged in the immediate proximity of the transmission interference suppression antenna. Arranged in the immediate proximity is regarded as being when the spacing from the foot of the transmission interference suppression antenna is less than one tenth of the wavelength of the center frequency of the excitation signal on the signal line. In one embodiment, the radio-frequency amplifier is a current source amplifier.

The proximity (e.g., with a current source amplifier) provides that the emitted transmission interference suppression signal due to the enforced current in the antenna also substantially matches the signal, which is supplied to the radio-frequency amplifier by the transmission interference suppression controller. For example, frequency dependencies are minimized thereby.

In one possible embodiment of the magnetic resonance tomography unit, the transmission interference suppression facility has a plurality of sensors and/or transmission interference suppression antennas at different locations respectively. For example, the sensors and/or transmission interference suppression antennas may surround the transmitting antenna or the magnetic resonance tomography unit in a plane (e.g., horizontally), in which people or other possibly disruptive apparatuses are located. In one embodiment, however, the arrangement of the sensors and/or transmission interference suppression antennas may surround the transmitting antenna only partially in order to prevent interference in only one particular direction to be protected, or to also enclose the transmitting antenna completely in all spatial directions in order to prevent any interference. The transmission interference suppression facility is also configured to determine a transmission interference suppression signal as a function of the excitation signal of the transmitter picked up via the plurality of sensors and to transmit the transmission interference suppression signal via the transmission interference suppression antennas, so that the excitation signal emitted by the transmitter via the transmitting antenna is attenuated at the locations of the sensors. For example, the transmission interference suppression controller may determine the phase shifts and attenuations of the individual transmission interference suppression signals via an optimization method such that, due to interference, a sum of the energies at the sensors is minimized.

In one embodiment of the magnetic resonance tomography unit, the transmission interference suppression signal has a plurality of components. For example, the plurality of components may be signals that, in each case, differ by phase and amplitude. The transmission interference suppression facility is configured to emit in each case one component via one transmission interference suppression antenna of the plurality of transmission interference suppression antennas. For example, the transmission interference suppression facility may have a plurality of radio-frequency amplifiers that amplify the components and, via signal lines, conduct the components to a plurality of transmitting antennas via which the transmission interference suppression signal or components of the transmission interference suppression signal are emitted.

In one embodiment, the transmission interference suppression facility may thus achieve a reduction in emission in many predetermined directions.

In one embodiment of the method, the method also has the act of emitting a test pulse with the transmitter via the transmitting antenna. A time-limited, predetermined radio-frequency wave train with known amplitude, frequency, and phase is regarded as a test pulse. In one embodiment, the amplitude is much lower than with an excitation signal (e.g., by more than 20 dB, 40 dB or 60 dB).

In a further act, the sensor detects a field strength of the radio-frequency electromagnetic field produced by the test pulse at the location of the sensor, depending on sensor, for example, E-field or H-field.

In a further act, the transmission interference suppression controller may determine a transfer function between transmitting antenna and sensor. At least an attenuation of the amplitude or a proportionality factor between amplitude of the test pulse and the field strength previously produced and detected by the sensor and a delay or phase shift of the detected signal in relation to the test pulse is regarded as a transfer function. The act of determining the transmission interference suppression signal takes place as a function of the transfer function. For example, the transmission interference suppression signal may be determined by applying the inverse of the determined transfer function and an inverse of a transfer function between sensor and transmission interference suppression antenna to an excitation signal.

In one embodiment of the method, the transmission interference suppression facility has a plurality of sensors and transmission interference suppression antennas. The sensors and transmission interference suppression antennas surround the transmitting antenna in a plurality of spatial directions or may surround the transmitting antenna entirely at least in one plane or in each spatial direction in order to be able to reduce the propagation of the interference in a plurality of directions. In the act of detection, the plurality of the sensors detect a field strength of the test pulse, and in the act of determining, the transmission interference suppression controller determines a plurality of transfer functions for the plurality of sensors. As already indicated in relation to an individual sensor, the act of determining the transmission interference suppression signal as a function of the plurality of transfer functions then takes place.

The ascertained transfer function may simplify and accelerate determining of the transmission interference suppression signals.

In one possible embodiment of the method, the method has the act of detecting a field strength of the excitation signal with the sensor. In the act of determining the transmission interference suppression signal, an optimization algorithm minimizes the energy of the excitation signal received with the sensor as a function of the detected field strength.

In one embodiment, the overall noise emission due to the excitation signal may be reduced by an optimization method.

If the sensors are not located in the far field or the location at which the EMC regulations are to be observed, by emitting test pulses via the transmitting antenna and/or the transmission interference suppression antennas, transfer functions may thus be ascertained with a calibration antenna at the location or in the far field. Using the transfer functions and their inverses, the transmission interference suppression signals to be emitted by the transmission interference suppression antennas are ascertained, which may result in destructive interference at the location or in the far field.

BRIEF DESCRIPTION OF THE DRAWINGS

FIG. 6 shows a schematic flowchart for an exemplary embodiment of a method.

DETAILED DESCRIPTION

Figure 1:
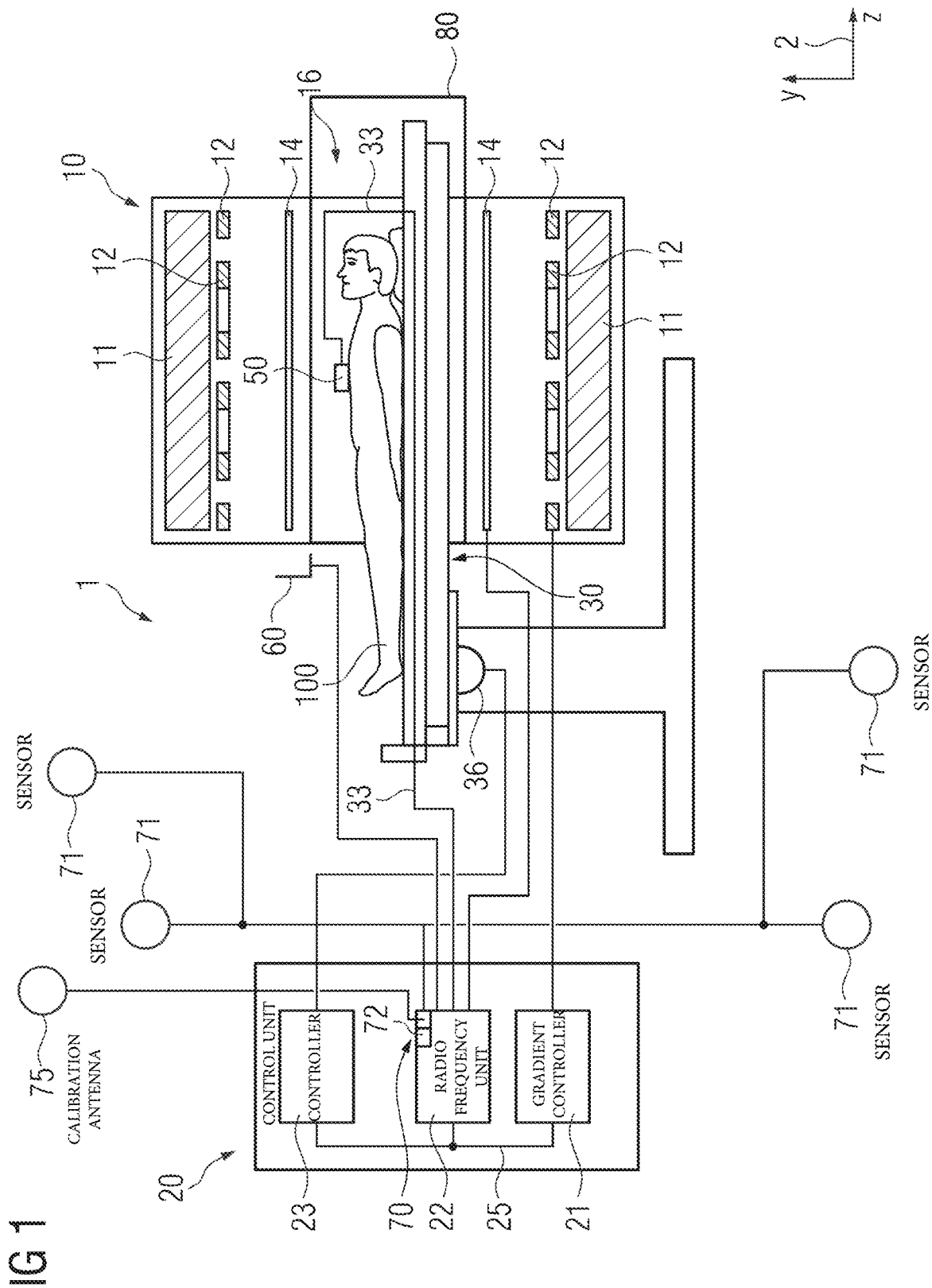
FIG. 1 shows a schematic representation of a magnetic resonance tomography unit with one embodiment of a transmission interference suppression facility.

FIG. 1 shows a schematic representation of an embodiment of a magnetic resonance tomography unit 1 with an embodiment of a transmission interference suppression facility 70.

The magnetic unit 10 has a field magnet 11 that generates a static magnetic field BO for an orientation of nuclear spins of samples or of the patient 100 in a recording region. The recording region is characterized by an extremely homogeneous static magnetic field BO, where the homogeneity relates, for example, to the magnetic field strength or the value. The recording region is almost spherical and arranged in a patient tunnel 16 that extends in a longitudinal direction 2 through the magnetic unit 10. A patient couch 30 may be moved in the patient tunnel 16 by the motion unit 36. Conventionally, the field magnet 11 is a superconducting magnet that may provide magnetic fields with a magnetic flux density of up to 3T or above. For lower field strengths, permanent magnets or electromagnets with normal-conducting coils may also be used, however.

Further, the magnetic unit 10 has gradient coils 12 that, for spatial differentiation of the detected mapping regions in the examination volume, are configured to overlay the magnetic field BO with variable magnetic fields in three spatial directions. The gradient coils 12 are conventionally coils made of normal-conducting wires that may generate mutually orthogonal fields in the examination volume.

The magnetic unit 10 also has a body coil 14 that is configured to irradiate a radio-frequency signal supplied via a signal line into the examination volume and to receive resonance signals emitted by the patient 100 and output the resonance signals via a signal line. Hereinafter, the term "transmitting antenna" designates an antenna via which the radio-frequency signal is emitted for excitation of the nuclear spins. This may be the body coil 14, but also a local coil 50 with transmission function.

A control unit 20 supplies the magnetic unit 10 with the different signals for the gradient coils 12 and the body coil 14 and evaluates the received signals.

The control unit 20 thus has a gradient actuator 21 that is configured to supply the gradient coils 12 via supply lines with variable currents, which, coordinated in terms of time, provide the desired gradient fields in the examination volume.

Further, the control unit 20 has a radio-frequency unit 22 that is configured to generate a radio-frequency pulse with a predefined course over time, amplitude, and spectral power distribution for excitation of a magnetic resonance of the nuclear spins in the patient 100. Pulse powers in the range of kilowatts may be achieved in the process. The excitation signals may be emitted via the body coil 14 or else via a local transmitting antenna into the patient 100.

A controller 23 communicates via a signal bus 25 with the gradient controller 21 and the radio-frequency unit 22.

Arranged on the patient 100 as a first receiving coil is a local coil 50, which is connected by a connection line 33 to the radio-frequency unit 22 and a receiver of the radio-frequency unit 22. In one embodiment, the body coil 14 may be a first receiving antenna within the present embodiments.

The magnetic resonance tomography unit 1 has an embodiment of a transmission interference suppression facility 70. This has a sensor or, for example, a plurality of sensors 71 that are configured to detect a radio-frequency signal with the Larmor frequency of the magnetic resonance tomography unit (e.g., scattered radiation of an excitation signal of the magnetic resonance tomography unit) and to relay the radio-frequency signal as a signal to the transmission interference suppression controller 72. These may be, for example, magnetic or electric antennas or other detectors for radio-frequency electric and/or magnetic alternating fields. The sensors 71 enclose the transmitting antenna at least in one plane (e.g., the horizontal plane) or in its entirety in all spatial directions to reduce propagation of emitted noise of the magnetic resonance tomography unit 1 into the surroundings.

In one embodiment, an embodiment of partial shielding 80 is arranged in other spatial directions in which no sensors 71 are arranged. In FIG. 1, this is configured as an electrically shielding closure of the patient tunnel 16 at the opening of the patient tunnel 16 opposing the transmission interference suppression antenna 60 and the sensor 71.

A partial cage may also be provided as a partial shielding 80 that at least partially surrounds the magnetic unit 10 with the transmitting antenna, and only leaves open, for example, openings that provide the required access to the patient 100. There is an interdependence between the number of sensors 71 and transmission interference suppression antennas 60 on the one side and the extent of the partial shielding 80 on the other side. For spatial directions in which the partial shielding extends with respect to the transmitting antenna, the propagation of signals of the transmitting antenna is reduced and the requirements for an active interference suppression by sensors 71 and transmission interference suppression antennas 60 are reduced. In these spatial directions, the density of the sensors 71 and transmission interference suppression antennas 60 may then be reduced or even completely omitted. For example, with a partial shielding 80 at an opening of the patient tunnel 16 in FIG. 1, only one active interference suppression is required in the direction of the opposing opening.

In one embodiment, the sensor(s) 71 are arranged in a far field of the transmitting antenna in which the electric and magnetic field of the electromagnetic radio-frequency alternating field are in phase and emitted electromagnetic waves propagate in the space. Since the sensor(s) 71 are located in the far field, the field strengths, downstream of the sensor 71, viewed from the transmitting antenna, may in each case also be easily inferred via the measured value of the sensor 71.

As the sensor is arranged at a spacing that matches a spacing predetermined for a limit value, observance of this limit value may be provided with the transmission interference suppression facility 70 of the present embodiments.

Alternatively, the sensor(s) 71 may not be arranged in the far field. Instead, in a calibration process using a calibration antenna in the far field or at a measuring point for EMC, a test signal that is emitted by the transmitting antenna and/or the transmission interference suppression antennas 60 may be detected. From this, in each case, transfer functions and corresponding inverse functions may be determined in order to determine a transmission interference suppression signal, which, when emitted via the transmission interference suppression antenna(s) 60 at the measuring point, forms a destructive interference with the excitation pulse of the transmitting antenna and thus reduces the electromagnetic emission.

The transmission interference suppression antenna 60 may be arranged in the proximity of the transmitting antenna in the patient tunnel 16 (e.g., on or with a plurality of transmission interference suppression antennas, around the opening of the patient tunnel). The transmission interference suppression antenna thus lies on the propagation path of the electromagnetic wave between the transmitting antenna and the sensor 71. The same also applies to a plurality of transmitters.

In one embodiment, the magnetic resonance tomography unit 1 also has a calibration antenna 75. The calibration antenna 75 is configured to ascertain test pulses emitted by the transmitting antenna or the transmission interference suppression antenna 60. In this case, detecting may be ascertaining an electric and or magnetic field strength. For example, amplitude and/or phase are detected in the process. The calibration antenna 75 may be, for example, a pickup coil or an electric antenna such as a dipole.

Figure 5:
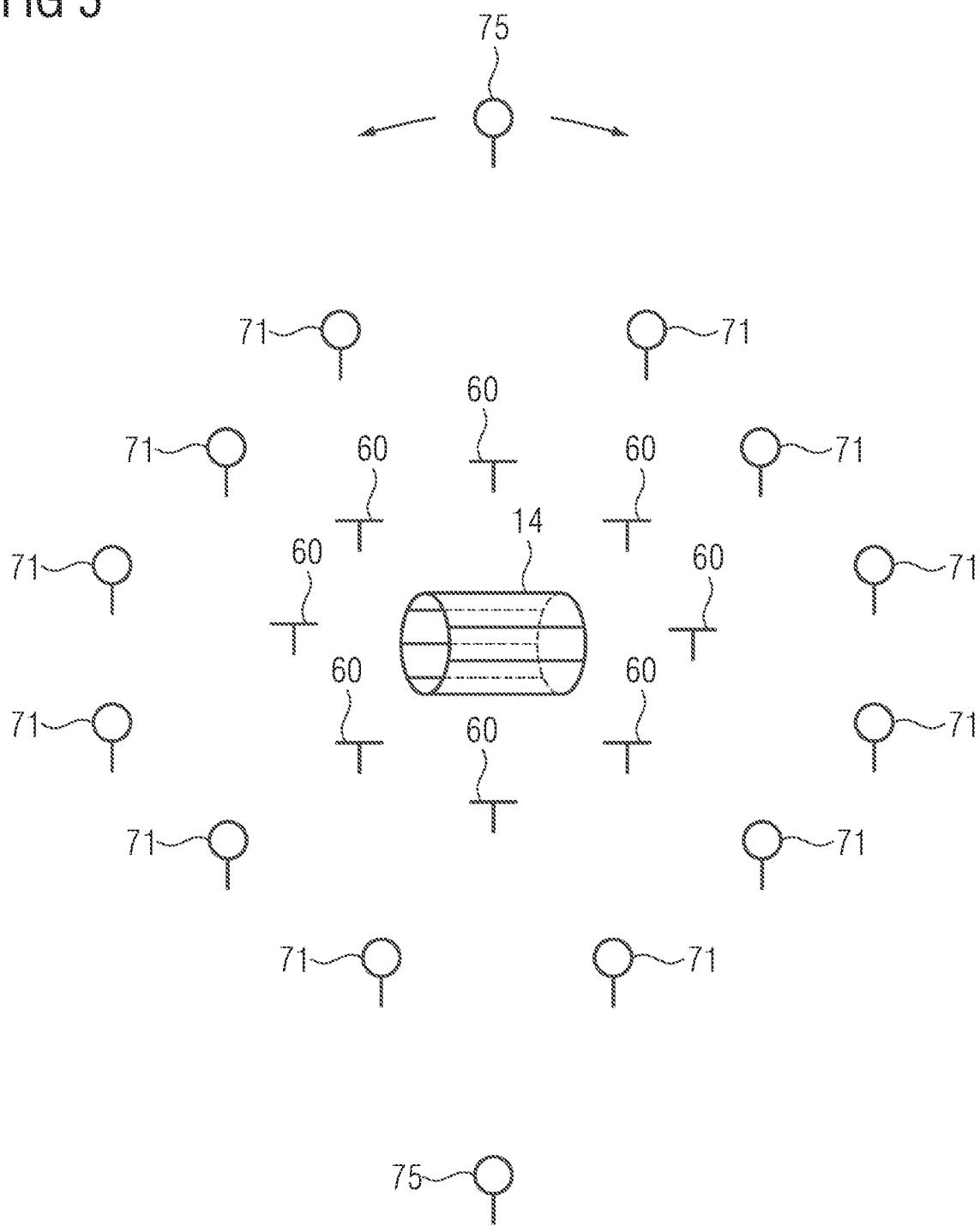
FIG. 5 shows a schematic representation of an embodiment of an arrangement of transmitting antenna, sensors, and transmission interference suppression antennas.

FIG. 5 schematically shows the relative arrangement of the transmitting antenna, the transmission interference suppression antennas 60, the sensors 71, and the calibration antenna 75 relative to each other.

The representation is two-dimensional. The same may also be provided, for example, three-dimensionally, however. The transmission interference suppression antennas 60 surround the transmitting antenna as a closed casing, and this is surrounded by a closed or partial casing including sensors 71. In one embodiment, however, the transmission interference suppression antennas 60 may surround the transmitting antennas with the casing including sensors 71 at a greater spacing (e.g., in the far field).

The transmitting antenna (e.g., the body coil 14) is surrounded by the transmission interference suppression antennas 60, and these are surrounded by the sensors 71. These form a closed ring or any other closed series of curves around the transmitting antenna. With transmission interference suppression in a three-dimensional direction, the sensors 71 form a closed casing or surface.

With transmission interference suppression in particular sectors or spatial directions, the sensors 71 form corresponding partial casings in the spatial directions, so that the projection of the partial casings outwardly from the transmitting antenna cover these spatial directions.

The spacing between respectively adjacent sensors 71 does not exceed a maximum spacing, which is, for example, less than a quarter, an eighth, or a tenth of the wavelength of the excitation signal. The sensors 71 detect field components tangentially to the enveloping curve. Based on the electromagnetic field equations, it is thereby possible to replace the source of the fields in the interior of the casing with known virtual sources on the surface of the casing. The fields of the transmitting antenna and of the transmission interference suppression antennas 60 outside of the casing including sensors 71 may thus be predicted with the sensors 71. This method of the virtual sources on the enclosing surface is also referred to as a Huygens' box. Transfer functions for a known excitation signal at the transmitting antenna or a transmission interference suppression antenna 60 and any desired point outside of the casing comprising sensors 71 may thus be determined.

The transmission interference suppression antenna(s) 60 may be arranged in the proximity of the transmitting antenna in the patient tunnel 16 (e.g., at, or in the case of a plurality of transmission interference suppression antennas 71, around the opening). The transmission interference suppression antenna 71 thus lies on the propagation path of the electromagnetic wave between the transmitting antenna and the sensor 71. The same also applies to a plurality of transmission interference suppression antennas 60.

The position of the calibration antenna 75 may be variable, so that the first test pulse or the second test pulse may be detected at different locations with the calibration antenna 75. In one embodiment, a plurality of calibration antennas 75 may be provided at different locations around the transmitting antenna and/or the transmission interference suppression antennas 60. The locations at which the test pulse is detected are in each case more remote from the transmitting antenna and/or the transmission interference suppression antenna(s) 60 than the sensors 71. If the sensors 71 form a casing or a partial casing around the transmitting antenna, in that the sensors 71 form the corner points of a polyhedron and the transmitting antenna and/or the transmission interference suppression antennas 60 are located in an interior of the polyhedron, the calibration antenna 75 is thus located outside of the polyhedron when detecting the test pulse.

In one embodiment, the spacing of the calibration antenna 75 from the transmitting antenna or the transmission interference suppression antenna(s) 60 is at least as large as results from the requirements of the EMC regulations. For example, a spacing of 10 m or less at which the field is to be below a defined threshold is to be provided. A spacing of less than 8 m or 5 m may also be provided. In one embodiment, the spacing may be at least a multiple of the wavelength of the excitation pulse in air.

The signals of the test pulse detected by the calibration antenna(s) 75 may be used by the transmission interference suppression facility 70 in order to correct the transfer functions for the transmitting antenna and the transmission interference suppression facility or functions derived therefrom. When ascertaining the transmission interference suppression signal, assumptions are made that are based on the measurements of the sensors only for the interior of the polyhedron comprising sensors 71. Assumptions are made (e.g., a free space-propagation of the waves or a reflection by ceiling or floor for the further propagation outside). The more detailed properties of the surroundings may only be taken into account by the test pulse detected by the calibration antenna 75. For example, if the calibration antenna 75 is arranged at a location that corresponds to a test spacing for an EMC measurement, observance of the EMC threshold value may thus be provided at this location, even without a sensor or an antenna being arranged there during operation.

Figure 2:
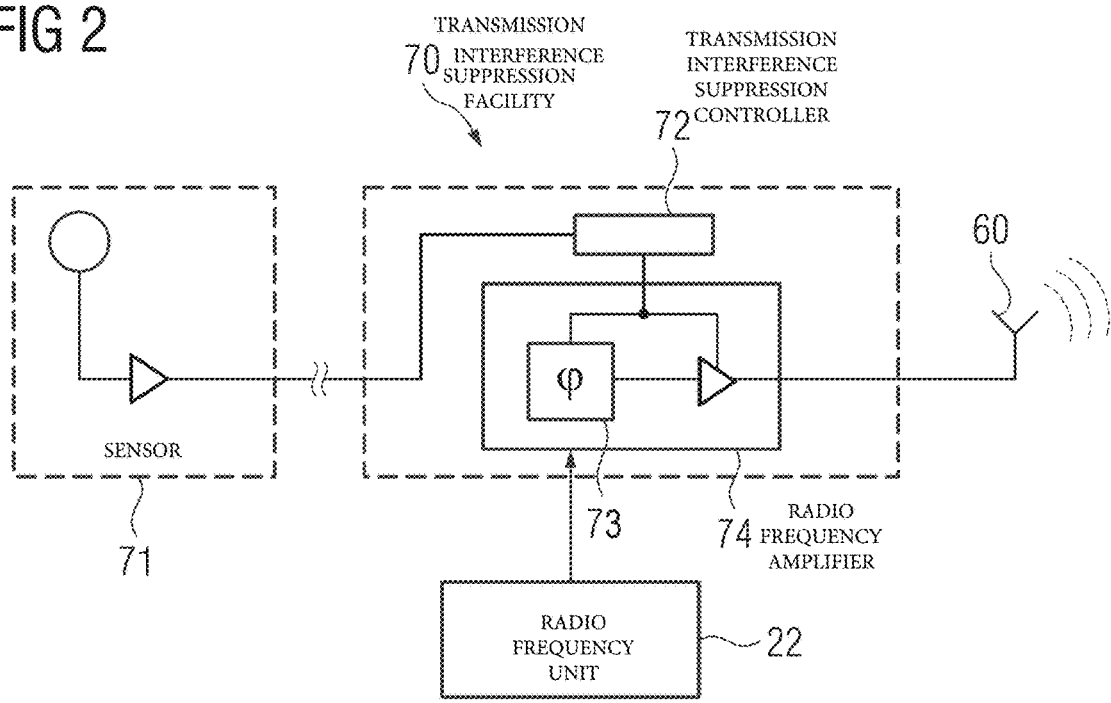
FIG. 2 schematically shows one possible embodiment of the transmission interference suppression facility in detail.

FIG. 2 schematically shows one possible embodiment of a transmission interference suppression facility 70 in detail.

For a better overview, only one sensor 60 is symbolically represented in FIG. 2, although the transmission interference suppression facility 70 has a plurality of sensors 60, as is indicated, for example, below in FIG. 3 or 5.

The sensor 60 has an antenna that converts the electric and/or magnetic radio-frequency alternating field of the pulse emitted by the transmitting antenna into a current and/or voltage in a conductor. In one embodiment, the sensor 60 detects components of the electromagnetic field tangentially to the enclosing casing, as is explained in relation to FIG. 5. For example, the antenna may be an induction loop or have two loops perpendicular to each other for detecting two tangential components. The electric signal generated in this way is conventionally amplified by a low noise amplifier (LNA) still in the sensor before the electric signal is relayed via a signal link for further processing in the transmission interference suppression facility 70.

FIG. 2 represents analog signal processing as an exemplary embodiment.

Basically, the concept is that an excitation signal propagating into the surroundings as an electromagnetic wave is reduced by destructive interference, and thus, the emission of the magnetic resonance tomography unit 1 into the surroundings is kept below a regulative limit value.

According to the present embodiments, the sensor 71 serves as a measuring device for the strength of the propagating electromagnetic wave of the transmitting antenna and the transmission interference suppression antennas 60, for example, to ascertain the transfer functions using test pulses. The transmission interference suppression facility 70 is then to obtain information about the excitation signal in a different way (e.g., as illustrated via a signal line from the radio-frequency unit 22 or the controller 23). The information is capable of generating a signal for a destructive interference. This may be, for example, the signal that is supplied in the radio-frequency unit 22 to an output stage for generating the excitation signal or an attenuated output signal of the output stage. This may also be a digitized form of the excitation signal or parameters or signals from which the excitation signal is generated and which define it sufficiently for the generation of a differential signal.

In one embodiment, however, the information about the excitation signal may be detected by a current sensor (e.g., a directional coupler at the foot of the transmitting antenna, such as the body coil 14). The directional coupler generates a signal that is proportional to the current that flows into the transmitting antenna, and therewith, also to the magnetic alternating field generated by the transmitting antenna. In one embodiment, two directional couplers that in each case detect the current flowing in and a reflected current may be used in order, by calculating the difference, to detect the current through the transmitting antenna more accurately.

The signal proportional to the current is relayed to the transmission interference suppression facility 70.

A scaled excitation signal is then subjected (e.g., by the phase shifter 73) to a phase shift and then amplified by the radio-frequency amplifier 74 before the excitation signal is emitted via the transmission interference suppression antenna 60. The transmission interference suppression controller 72 adjusts the parameters in the process (e.g., phase shift and amplification) as a function of the signal of the sensor 71. As already explained, this may take place using the transfer functions.

The transmission interference suppression antennas 60 are arranged in the proximity of the transmitting antenna in the patient tunnel 16 (e.g., around the opening). A greater spacing may also be provided, however, to reduce a reaction of the transmission interference suppression antennas 71 to the excitation of the nuclear spins. In one embodiment, however, the transmission interference suppression antennas 60 may be arranged in the interior of the patient tunnel 16.

Figure 3:
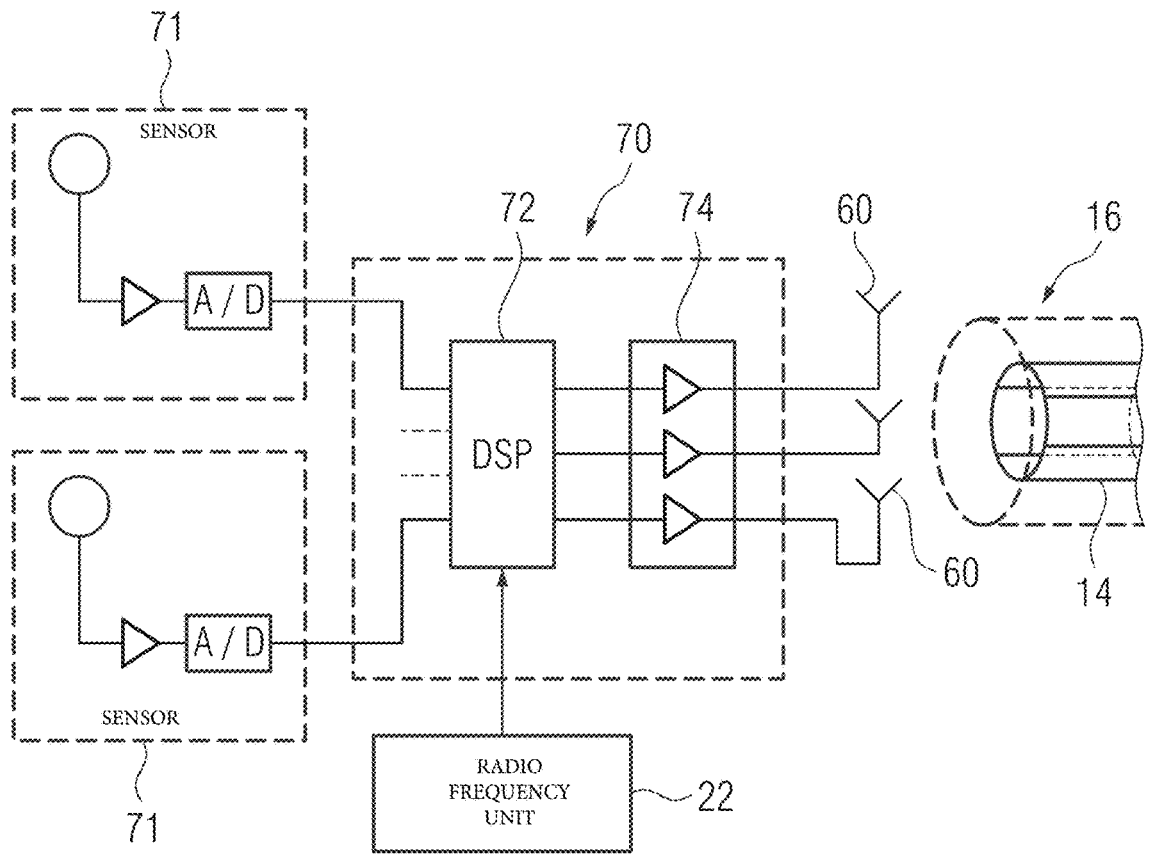
FIG. 3 schematically shows a further exemplary embodiment of the transmission interference suppression facility in detail.

A further embodiment of the transmission interference suppression facility is represented in FIG. 3.

FIG. 3 illustrates a plurality of sensors 71 and also a plurality of transmission interference suppression antennas 60. These are distributed as a far as possible over different spatial directions with respect to the transmitting antenna (e.g., the body coil 14), as was already stated in relation to FIG. 5. In order to supply this plurality of transmission interference suppression antennas 60 with different signals, as is necessary for suppression of the emitted interference in different directions, the controllable radio-frequency amplifier 74 has a plurality of independent amplifier channels for amplification of the individual signals.

In the embodiment in FIG. 3, the transmission interference suppression controller 72 has a signal processing resource (e.g., a Digital Signal Processor (DSP) or an FPGA). In this exemplary embodiment, the sensors 71 already digitize the signals and relay the signals to the transmission interference suppression controller 72. As already described, the phase shifts and attenuation/amplification factors may be ascertained, for example, by the transfer functions. The phase shift and amplification/attenuation may then be carried out by corresponding digital computer operation.

In one embodiment, the signals picked up with the calibration antenna 75 may be used to correct the transfer functions.

In one embodiment, however, these acts may take place in an analog signal processing, with the mixing taking place, for example, by way of a crossbar matrix with adjustable couplings and phase shift at intersection points.

Figure 4:
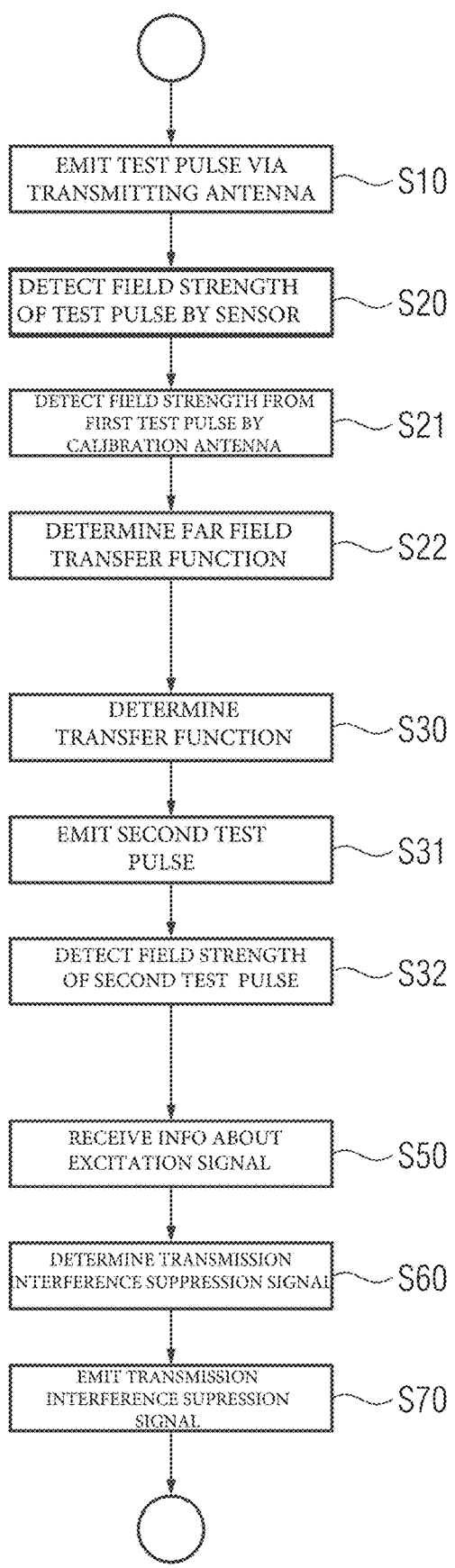
FIG. 4 shows a schematic flowchart for an exemplary embodiment of a method.

Further, in FIG. 4, the radio-frequency amplifiers 74 are arranged in the immediate proximity of the transmission interference suppression antennas 60 and are configured as a current source with internal resistance approaching zero, so that the transmission interference suppression antennas 60, in the case of the same transmission interference suppression signal, generate a magnetic alternating field largely independent of the antenna impedance, even if, for example, the impedance changes with the frequency.

FIG. 4 shows an exemplary flowchart of the method for operation of the transmission interference suppression facility 70 in a magnetic resonance tomography unit 1.

In act S50, the transmission interference suppression facility 70 receives information about the excitation signal. In the simplest case, this may be the excitation signal itself or a signal proportional to the excitation signal (e.g., attenuated by a factor of 20 dB, 40 dB, 60 dB or more). With predetermined excitation signals for known sequences (e.g., a sinc pulse), it may be sufficient, however, if scaling factor, center frequency, phase relationship, and/or duration are given as the information. For example, the baseband signal of the excitation signal and the mixing frequency may also be provided.

In act S60, the transmission interference suppression controller determines a transmission interference suppression signal as a function of the information such that on emitting the transmission interference suppression signal via the transmission interference suppression antenna, a field strength of the excitation signal is reduced at a predetermined location.

For example, a calculation based on Maxwell's field equation and a known geometry, in which the attenuation and phase shift of the excitation signal is ascertained at the sensor from the known excitation signal (e.g., similarly, an attenuation and a phase shift), may be provided. Using the information about the excitation signal, a corresponding transmission interference suppression signal with the inverse phase shift and corresponding amplification may then be determined, so that a negative interference with an attenuation greater than 6 dB, 12 dB, or more is achieved. In act S70, the transmission interference suppression signal is then emitted via the transmission interference suppression antenna 60.

As already illustrated, the arrangement of the sensors 71 on a casing around the transmitting antenna and the detection of the fields by the sensors 71 allows, in line with a Huygens' box, the field source in the interior of the casing to be replaced by a virtual source on the casing and thus changes (e.g., due to the patient) to be co-detected and taken into account.

In one embodiment, however, instead of the calculation in act S10, a test pulse is emitted with the transmitter via the transmitting antenna, and then, in act S20, a field strength produced by the test pulse is detected by the sensors 71. The sensors 71 may detect, for example, the electric or the magnetic component. In one embodiment, as already explained in relation to FIG. 5, the sensors 71 detect components of the fields that are oriented tangentially to the virtual casing on which the sensors 71 are arranged.

In act S30, using the known properties of the test pulse and the properties detected by the sensor 71, a transfer function between transmitting antenna and a predetermined point in the far field outside of the casing including sensors 71 is determined by the transmission interference suppression facility 70. In one embodiment, at least a delay (e.g., the phase shift) and the attenuation are determined. As already explained, this may take place using a Huygens' box.

In act S60, the transmission interference suppression signal is ascertained as a function of the transfer function. As already stated in relation to the calculation, this may be achieved with the transfer function determined via the test pulse by a corresponding inverse phase shift and amplification, or, more generally, by the inverse transfer function.

Determining the transfer function(s) via a test pulse allows conditions that are not accessible to the calculation to also be detected since, for example, the properties of the patient are only partially known.

In one embodiment, a transfer function between one or more transmission interference suppression antenna(s) 60 and a predetermined location in the far field may be determined in the same way. Different variations of the method may then be provided. For example, the transmission interference suppression signal may be determined directly from the transfer functions and the information about the excitation signal. In one embodiment, the transfer function(s) are determined on installation of the magnetic resonance system 1. In one embodiment, determining takes place at least in each case before an image capture, however, in order to take into account the change due to the patient.

In the previously described embodiment, the method makes assumptions about the propagation in the surroundings of the magnetic resonance tomography unit 1 outside of the polyhedron including sensors 71. To be able to take the propagation into account more effectively, the properties of the surroundings may be detected by measurements with a calibration antenna 75.

For this, the calibration antenna may be arranged in act S10 at a location at a greater spacing from the transmitting antenna than the sensors 71. In one embodiment, the spacing corresponds to a spacing, predefined by an EMC regulation, for a limit value of the emitted field. In act S21, a field strength generated by the first test pulse via the transmitting antenna is detected with the calibration antenna 5. In one embodiment, the detection may take place via a receiver of the magnetic resonance tomography unit 1, which is connected via a wired or wireless signal link to the calibration antenna. In one embodiment, however, the data may be acquired with a test receiver, and correction parameters derived therefrom may be stored in the transmission interference suppression controller 72. In one embodiment, a phase delay is also detected in the process in order to subsequently be able to generate a destructive interference during transmission interference suppression.

In one embodiment, a second test pulse may be detected correspondingly act step S31 with the calibration antenna 75. The second test pulse is emitted via the transmission interference suppression antennas 60. This may take place in each case for different positions of the calibration antenna 75 and for all transmission interference suppression antennas 60. For example, for one position of the calibration antenna 75, in each case successively, the first test pulse may be emitted via the transmitting antenna and detected via the calibration antenna 75 and the second test pulse via all transmission interference suppression antennas 60. In an embodiment, the first test pulse is also detected with the sensors 71 in order to ascertain a transfer function between transmitting antenna and the sensors 71.

In one embodiment, acts S10 to S21 or S31 are repeated with a calibration antenna 75 positioned at a different location. The position of the calibration antenna 75 may be changed, or a different calibration antenna 75 may be used at a different position.

Once all measured values have been acquired, the target values are determined at the sensors 71. A vector V is sought, which describes the actuation of the transmission interference suppression antennas 60, so that this results in an elimination of the fields in the far field. In principle, V is obtained from the following equation (e.g., at the H-field):
$H_{BC}+H_{TxAux(\,)}*V=0$.

With suitable matrix notation, V may be determined by matrix inversion (e.g., pseudoinverse). Firstly, V is determined for the case where the H-field from the far-field measurement at the movable calibration antennas 75 is used
$H_{BC}+H_{TxAux(far\ field)}*V=0$.

As a rule, "=0" is not always satisfied, but it is important that the value is less than the EMC limit value. The value for V may also be obtained from a minimization of the function, therefore.

The ascertained vector V is now taken, and the fields, which remain in the near field at the Tx sense antennas, are calculated. These are to be saved for later as the target field $H_{BC} + H_{TxAux(near\ field)} * V = H\_target_{(Tx\ sense)}$.

During regular operation of the MR unit, only the fixed sensors are then still present. It continues to be provided that the EMC emission conditions are observed.

For this, a series of test pulses is again sent during the current measuring situation to all antennas, and a new actuation vector V2 that suppresses the far-field emission or reduces the far-field emission such that the far-field emission remains under the EMC limits is sought. The target field ascertained during the calibration is used for this, and V2 is determined according to the following equation: $H_{BC} - H\_target_{(Tx\ sense)} + H_{TxAux(near\ field)} * V2 = 0$.

This information is subsequently used in act S60 of determining the interference suppression signal as a function of the far field transfer function to correct the transmission interference suppression signal.

FIG. 6 shows a further exemplary flowchart of the method for operation of the inventive transmission interference suppression facility 70 in an embodiment of the magnetic resonance tomography unit 1.

In act S50, the transmission interference suppression facility 70 receives information about the excitation signal. In the simplest case, this may be the excitation signal itself or a signal proportional to the excitation signal (e.g., attenuated by 20 dB, 40 dB, 60 dB, or more). This may be detected, for example, in act S40 by a pick-up coil from the generated field or by a directional coupler from the signal supplied to the transmitting antenna.

With predetermined excitation signals for known sequences, for example, a sinc pulse may also be sufficient, however, if scaling factor, center frequency, phase relationship, and/or duration are given as the information. For example, the baseband signal of the excitation signal and the mixing frequency may also be provided.

In act S60, the transmission interference suppression controller determines a transmission interference suppression signal as a function of the information such that on emitting the transmission interference suppression signal via the transmission interference suppression antenna, a field strength of the excitation signal is reduced at a predetermined location.

For example, a calculation based on Maxwell's field equation and a known geometry, in which the attenuation and phase shift of the excitation signal are ascertained at the sensor from the known excitation signal (e.g., similarly, an attenuation and a phase shift), may be provided. Using the information about the excitation signal, a corresponding transmission interference suppression signal may then be determined with the inverse phase shift and corresponding amplification, so that a negative interference with an attenuation greater than 6 dB, 12 dB, or more is achieved. In act S70, the transmission interference suppression signal is then emitted via the transmission interference suppression antenna 60.

In one embodiment, however, instead of the calculation, in act S10 of emitting, a test pulse is emitted with the transmitter via the transmitting antenna, and then, in act S20 of detecting, a field strength produced by the test pulse is detected by the sensor. The sensor may detect, for example, the electric or the magnetic component.

In act S30, a transfer function between transmitting antenna and sensor 71 is determined by the transmission interference suppression facility 70 using the known properties of the test pulse and the properties detected by the sensor 71. For example, an autocorrelation algorithm may be provided. In one embodiment, at least a delay (e.g., the phase shift) and the attenuation are ascertained.

In act S60, the transmission interference suppression signal is ascertained as a function of the transfer function. As already stated in relation to the calculation, this may be achieved with the transfer function determined via the test pulse by a corresponding inverse phase shift and amplification, or, more generally, by the inverse transfer function.

Determining the transfer function(s) via a test pulse allows even conditions that are not accessible to the calculation to be detected since, for example, the properties of the patient are only partially known.

In one embodiment, a transfer function between one or more transmission interference suppression antenna(s) 60 and one or more sensor(s) 71 may be determined in the same way.

For example, in act S31, a predetermined second test pulse may be emitted with the transmission interference suppression facility via the transmission interference suppression antenna. In one embodiment, the previously described test pulse and the second test pulse may be identical. In act S32, the field strength produced by the second test pulse is detected by the plurality of sensors, and then, a far field transfer function for the transmission interference suppression antenna is ascertained as a function of the second test pulse by the transmission interference suppression facility; the function is then taken into account when determining the transmission interference suppression signal in act S60.

Different variations of the method may then be provided. For example, the transmission interference suppression signal may be determined directly from the transfer functions and the information about the excitation signal. In one embodiment, the transfer function(s) may be determined once during the installation of the magnetic resonance tomography unit 1. In one embodiment, determining takes place at least in each case before an image capture, however, in order to take into account the change due to the patient.

In one embodiment, the transfer functions or the parameters of the transfer functions, such as attenuation and phase shift, may also be permanently adjusted by an optimization method in which, for example, the energy of the signal detected by the sensors 71, resulting from excitation signal and transmission interference suppression signal, is minimized. At the same time, the emission of the excitation signal in the surroundings of the magnetic resonance tomography unit is minimized thereby since the sensors are already arranged in the far field and thereby indicate a measure of the fields at a large spacing.

Although the invention has been illustrated and described in detail by the exemplary embodiments, the invention is not limited by the disclosed examples, and a person skilled in the art may derive other variations herefrom without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography unit comprising:
a field magnet;
a transmitter;
a transmitting antenna operable to excite nuclear spins;
a calibration antenna configured to receive a calibration signal; and
a transmission interference suppression facility comprising:
a transmission interference suppression controller;
a plurality of sensors; and
a transmission interference suppression antenna,
wherein the transmission interference suppression facility is configured to:
pick up, with the plurality of sensors, an excitation signal of the transmitter;
determine, with the transmission interference suppression controller, a transmission interference suppression signal as a function of the excitation signal of the transmitter; and
emit the transmission interference suppression signal via the transmission interference suppression antenna, so that at a predetermined location outside of the magnetic resonance tomography unit, an electromagnetic alternating field of an excitation signal emitted by the transmitter via the transmitting antenna is attenuated, and
wherein the plurality of sensors are arranged in a near field of the transmitting antenna, and the predetermined location of the attenuation is in a far field of the transmitting antenna, and
wherein the calibration antenna is arranged at a greater spacing from the transmitting antenna than the plurality of sensors.

2. The magnetic resonance tomography unit of claim 1, wherein the plurality of sensors surround the transmitting antenna at least in one interference suppression direction.

3. The magnetic resonance tomography unit of claim 1, wherein the plurality of sensors surround the transmission interference suppression antenna at least in one interference suppression direction.

4. The magnetic resonance tomography unit of claim 1, wherein the transmission interference suppression facility includes a plurality of transmitting antennas at in each case different locations,
wherein the transmission interference suppression signal has a plurality of components,
wherein the transmission interference suppression facility is further configured to:
determine components of the transmission interference suppression signal as a function of a pulse of the transmitter picked up via the plurality of sensors; and
emit the transmission interference suppression signal in each case via the plurality of transmission interference suppression antennas, so that the excitation signal emitted by the transmitter via the transmitting antenna is attenuated at a predetermined location in the far field of the magnetic resonance tomography unit.

5. A magnetic resonance tomography unit comprising:
a magnetic unit;
a transmitter;
a transmitting antenna operable to excite nuclear spins;
a partial shielding that is arranged in a first spatial direction relative to the magnetic resonance tomography unit and is operable to shield the magnetic resonance tomography unit in at least the first spatial direction;
a transmission interference suppression facility comprising:
a transmission interference suppression controller;
a sensor; and
a transmission interference suppression antenna,
wherein the transmission interference suppression facility is configured to:
acquire, with the sensor, an excitation signal of the transmitter for exciting nuclear spins;
determine, with the transmission interference suppression controller, a transmission interference suppression signal as a function of the acquired excitation signal of the transmitter; and
emit the transmission interference suppression signal via the transmission interference suppression antenna, so that the excitation signal emitted by the transmitter via the transmitting antenna is attenuated at a predetermined location outside of the magnetic resonance tomography unit.

6. The magnetic resonance tomography unit of claim 5, wherein the sensor is arranged in a second spatial direction relative to the magnetic resonance tomography unit, the second spatial direction being different than the first spatial direction.

7. The magnetic resonance tomography unit of claim 5, wherein the partial shielding is operable to shield the magnetic resonance tomography unit in a plurality of different spatial directions.

8. The magnetic resonance tomography unit of claim 6, further comprising a patient tunnel,
wherein the partial shielding is operable to electromagnetically close the patient tunnel at one end.

9. The magnetic resonance tomography unit of claim 5, wherein the sensor is arranged in a far field of the transmitting antenna, and the predetermined location of the attenuation is a location of the sensor.

10. The magnetic resonance tomography unit of claim 5, wherein the transmission interference suppression facility comprises:
a plurality of sensors, the plurality of sensors comprising the sensor; and
transmission interference suppression antennas at in each case different locations, the transmission interference suppression antennas comprising the transmission interference suppression antenna,
wherein the transmission interference suppression facility is further configured to:
determine the transmission interference suppression signal as a function of the excitation signal of the transmitter picked up via the plurality of sensors; and
emit the transmission interference suppression signal via the transmission interference suppression antennas, so that the excitation signal emitted by the transmitter via the transmitting antenna is attenuated at locations of the plurality of sensors.

11. The magnetic resonance tomography unit of claim 10, wherein the transmission interference suppression signal has a plurality of components, and
wherein the transmission interference suppression facility is further configured to emit in each case one component via one transmission interference suppression antenna of the transmission interference suppression antennas.

12. A method for operation of a magnetic resonance tomography unit, the method comprising:
emitting a predetermined first test pulse with a transmitter via a transmitting antenna;
detecting, by a plurality of sensors, a field strength produced by the first test pulse;
determining, by a transmission interference suppression facility, a far field transfer function for the transmitting antenna as a function of the first test pulse;
receiving information about an excitation signal with a plurality of sensors;
determining, by a transmission interference suppression controller, an interference suppression signal as a function of the information such that on emitting the interference suppression signal via the transmission interference suppression antenna, a field strength of the excitation signal is reduced at a predetermined location in a far field;
emitting the interference suppression signal via the transmission interference suppression antenna;
arranging a calibration antenna at a location at a greater spacing from the transmitting antenna than the plurality of sensors; and
detecting, by the calibration antenna, a field strength produced by the first test pulse,
wherein the determining the interference suppression signal takes place as a function of the far field transfer function, and
wherein determining the interference suppression signal as a function of the far field transfer function comprises determining the interference suppression signal also as a function of the detected field strength of the calibration antenna.

13. The method of claim 12, further comprising the emitting of the first test pulse, the detecting, by the plurality of sensors, of the field strength produced by the first test pulse, and the arranging, and the detecting, by the calibration antenna, of the field strength produced by the first test pulse with a calibration antenna positioned at a different location.

14. A method for operation of a magnetic resonance tomography unit, the method comprising:
emitting a predetermined first test pulse with a transmitter via a transmitting antenna;
detecting, by a plurality of sensors, a field strength produced by the first test pulse;
determining, by a transmission interference suppression facility, a far field transfer function for the transmitting antenna as a function of the first test pulse;
receiving information about an excitation signal with a plurality of sensors;
determining, by a transmission interference suppression controller, an interference suppression signal as a function of the information such that on emitting the interference suppression signal via the transmission interference suppression antenna, a field strength of the excitation signal is reduced at a predetermined location in a far field;
emitting the interference suppression signal via the transmission interference suppression antenna;
emitting a predetermined second test pulse with the transmission interference suppression facility via the transmission interference suppression antenna;
detecting, by the plurality of sensors, a field strength produced by the second test pulse; and
determining, by the transmission interference suppression facility, a far field transfer function for the transmission interference suppression antenna as a function of the second test pulse by way of the transmission interference suppression facility,
wherein the determining of the interference suppression signal takes place as a function of the far field transfer function for the transmitting antenna and as a function of the far field transfer function for the transmission interference suppression antenna.

15. The method of claim 14, wherein the magnetic resonance tomography unit comprises a calibration antenna configured to receive a calibration signal, wherein the calibration antenna is arranged at a greater spacing from the transmitting antenna than the plurality of sensors,
wherein the method further comprises:
arranging the calibration antenna at a location at a greater spacing from the transmission interference suppression antenna than the plurality of sensors; and
detecting, by the calibration antenna, a field strength produced by the second test pulse, and
wherein the determining the interference suppression signal as a function of the far field transfer function also takes place as a function of the detected field strength of the calibration antenna.

16. The method of claim 12, further comprising repeating the emitting of the first test pulse, the detecting, by the plurality of sensors, of the field strength produced by the first test pulse, the arranging, and the detecting, by a calibration antenna, of the field strength produced by the first test pulse with the calibration antenna positioned at a different location.

17. The method of claim 14, wherein the transmission interference suppression facility has a plurality of transmission interference suppression antennas,
wherein the method further comprises determining a plurality of far field transfer functions for the plurality of the transmission interference suppression antennas, the plurality of far field transfer functions comprising the determined far field transfer function, and
wherein the determining of the interference suppression signal takes place as a function of the plurality of far field transfer functions for the plurality of the transmission interference suppression antennas.

18. The method of claim 15, wherein detecting, by the calibration antenna, the field strength produced by the second test pulse comprises detecting, by the calibration antenna, a field strength produced by the second test pulse for each transmission interference suppression antenna.

19. A method for operation of a magnetic resonance tomography unit, the method comprising:
receiving information about an excitation signal;
determining, by a transmission interference suppression controller, a transmission interference suppression signal as a function of the information such that on emitting the transmission interference suppression signal via a transmission interference suppression antenna, a field strength of the excitation signal is reduced at a predetermined location;
emitting the transmission interference suppression signal via the transmission interference suppression antenna;
emitting, by a transmitter, a test pulse via the transmitting antenna;
detecting, by a sensor, a field strength produced by the test pulse;

determining, by a transmission interference suppression facility, a transfer function between the transmitting antenna and the sensor, wherein the transmission interference suppression facility includes a plurality of sensors and transmission interference suppression antennas, the plurality of sensors including the sensor and the transmission interference suppression antennas including the transmission interference suppression antenna, wherein the transmission interference suppression antennas are at in each case different locations;

detecting, by the plurality of sensors, the field strength produced by the test pulse;

determining, by the transmission interference suppression facility, a plurality of transfer functions for the plurality of sensors, the plurality of transfer functions including the transfer function;

emitting a predetermined second test pulse with the transmission interference suppression facility via the transmission interference suppression antenna;

detecting, by the plurality of sensors, a field strength produced by the second test pulse;

determining, by the transmission interference suppression facility, a far field transfer function for the transmission interference suppression antenna as a function of the second test pulse and the detected produced field strength;

arranging a calibration antenna at a location at a greater spacing from the transmission interference suppression antenna than the plurality of sensors; and detecting, by the calibration antenna, a field strength produced by the second test pulse, wherein determining the transmission interference suppression signal takes place as a function of the plurality of transfer functions, including the transfer function, wherein the determining of the transmission interference suppression signal takes place as a function of the far field transfer function for the transmission interference suppression antenna and also as a function of the detected field strength of the calibration antenna.

20. The method of claim 19, further comprising detecting a field strength of the excitation signal with the sensor, wherein determining the transmission interference suppression signal comprises minimizing, with an optimization algorithm, energy of the excitation signal received with the sensor as a function of the detected field strength.

* * * * *